United States Patent
Curtis et al.

(10) Patent No.: US 10,475,485 B2
(45) Date of Patent: Nov. 12, 2019

(54) SYSTEMS AND METHODS FOR POWER AND THERMAL THROTTLING OF MEMORY DEVICES VIA CAPACITY REDUCTION

(71) Applicant: Dell Products L.P., Round Rock, TX (US)

(72) Inventors: Robert B. Curtis, Georgetown, TX (US); Mukund P. Khatri, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 15/614,197

(22) Filed: Jun. 5, 2017

(65) Prior Publication Data

US 2018/0350410 A1    Dec. 6, 2018

(51) Int. Cl.
    G06F 9/50      (2006.01)
    G11C 7/04      (2006.01)
    G11C 5/14      (2006.01)
    G06F 1/20      (2006.01)

(52) U.S. Cl.
    CPC .............. *G11C 7/04* (2013.01); *G06F 9/5016* (2013.01); *G06F 9/5094* (2013.01); *G06F 1/206* (2013.01); *G11C 5/14* (2013.01)

(58) Field of Classification Search
    CPC ........ G06F 9/5016; G06F 9/5094; G06F 1/20; G11C 7/04
    See application file for complete search history.

(56) References Cited

U.S. PATENT DOCUMENTS

| | | | | |
|---|---|---|---|---|
| 7,688,304 B2* | 3/2010 | Park | ................... | G09G 3/3648 345/101 |
| 2003/0061448 A1* | 3/2003 | Rawson, III | ........ | G06F 12/0866 711/133 |
| 2006/0092110 A1* | 5/2006 | Park | ................... | G09G 3/3648 345/87 |
| 2009/0083506 A1* | 3/2009 | Reed | ................. | G11C 7/04 711/163 |
| 2014/0101371 A1* | 4/2014 | Nguyen | .............. | G06F 3/0616 711/103 |
| 2017/0024297 A1* | 1/2017 | Sogabe | .............. | G06F 11/2094 |

* cited by examiner

*Primary Examiner* — Than Nguyen
(74) *Attorney, Agent, or Firm* — Jackson Walker L.L.P.

(57) ABSTRACT

In accordance with embodiments of the present disclosure, an information handling system may include a processor, a memory system communicatively coupled to the processor, a cooling system configured to provide thermal control for information handling resources of the information handling system, and a memory capacity control agent embodied as a program of instructions configured to, when executed determine a capability of the cooling system for cooling memory devices of the memory system based on a configuration of the information handling system and manipulate a memory capacity of the memory system based on the capability.

18 Claims, 2 Drawing Sheets

SYSTEMS AND METHODS FOR POWER AND THERMAL THROTTLING OF MEMORY DEVICES VIA CAPACITY REDUCTION

TECHNICAL FIELD

The present disclosure relates in general to information handling systems, and more particularly to systems and methods for power and thermal control of an information handling system via reduction of memory capacity.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, air movers (e.g., cooling fans and blowers) have often been used in information handling systems to cool information handling systems and their components.

Among the components whose thermal impact is increasing over time are memory devices, such as dual-inline memory modules (DIMMs) often used to implement dynamic random access memory (DRAM). Such thermal impact has increased as memory capacity and density used in information handling systems have increased, as well as increased power associated with improvements in DIMM technology. As memory capacities increase, higher-power memory modules may become more common, and thermal limits and thresholds in information handling systems may be increasingly violated in the absence of countermeasures. Traditional approaches to avoiding violation of such thermal limits and thresholds have included sales restrictions of memory devices by suppliers of information handling systems. In addition, it has traditionally been difficult to actively throttle or put power caps on memory modules within a server system using existing methods.

SUMMARY

In accordance with the teachings of the present disclosure, the disadvantages and problems associated with thermal management in an information handling system may be reduced or eliminated.

In accordance with embodiments of the present disclosure, an information handling system may include a processor, a memory system communicatively coupled to the processor, a cooling system configured to provide thermal control for information handling resources of the information handling system, and a memory capacity control agent embodied as a program of instructions configured to, when executed determine a capability of the cooling system for cooling memory devices of the memory system based on a configuration of the information handling system and manipulate a memory capacity of the memory system based on the capability.

In accordance with these and other embodiments of the present disclosure, a method may include determining a capability of a cooling system of an information handling system for cooling memory devices of a memory system of the information handling system based on a configuration of the information handling system and manipulating a memory capacity of the memory system based on the capability.

In accordance with these and other embodiments of the present disclosure, an article of manufacture may include a non-transitory computer-readable medium and computer-executable instructions carried on the computer readable medium, the instructions readable by a processor, the instructions, when read and executed, for causing the processor to determine a capability of a cooling system of an information handling system for cooling memory devices of a memory system of the information handling system based on a configuration of the information handling system and manipulate a memory capacity of the memory system based on the capability.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
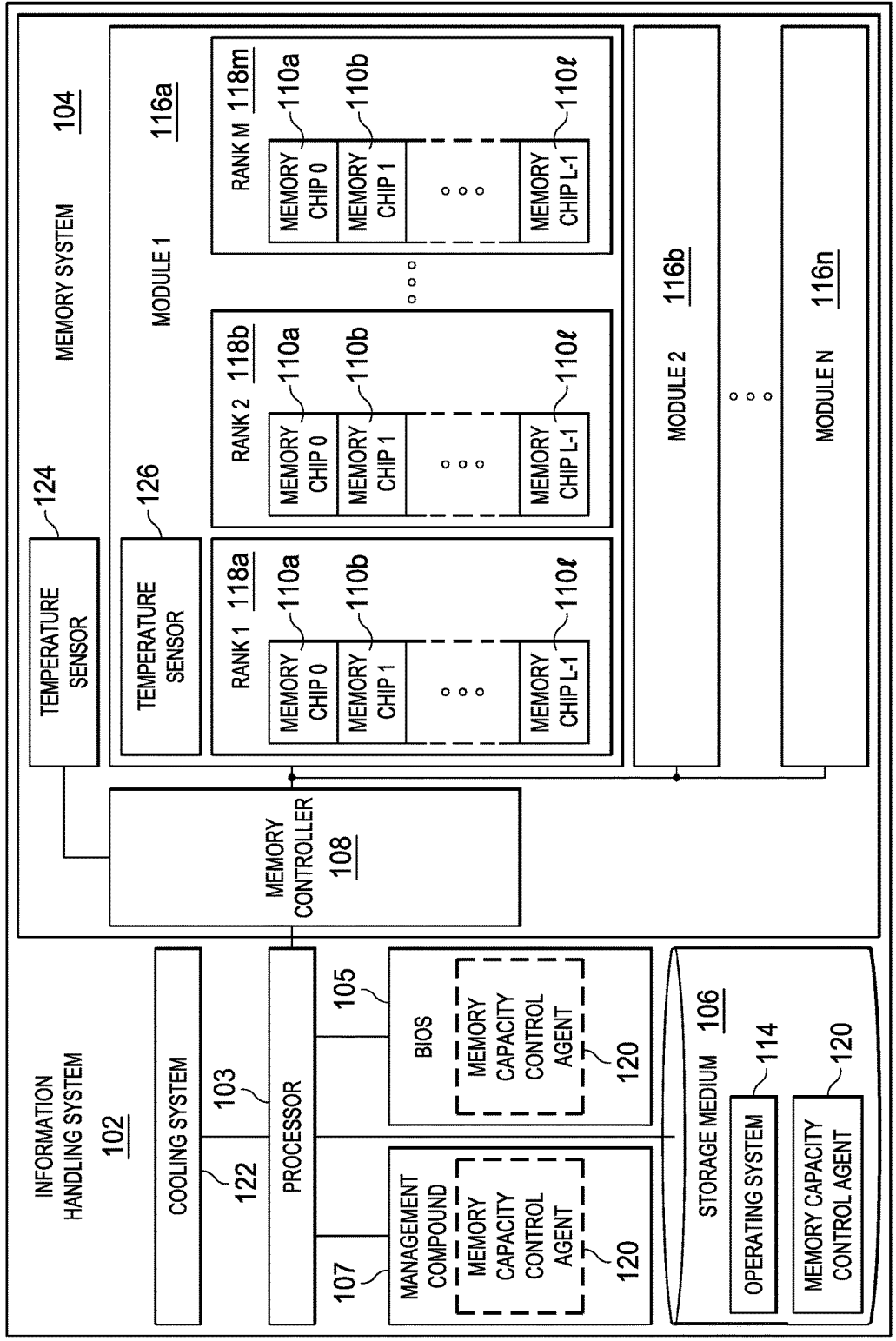
FIG. 1 illustrates a block diagram of an example information handling system, in accordance with embodiments of the present disclosure.
Figure 2:
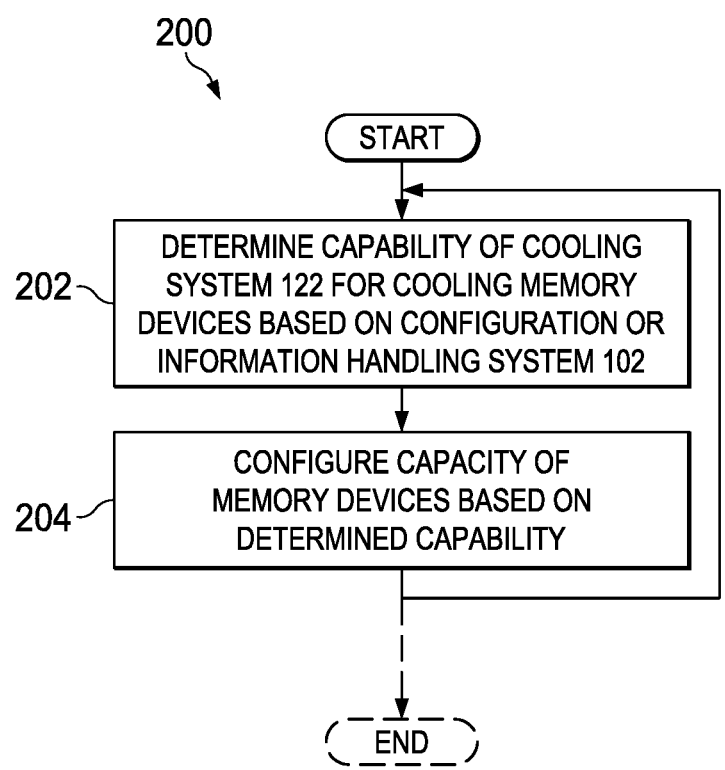
FIG. 2 illustrates a flow chart of an example method for power and thermal throttling of memory devices via capacity reduction, in accordance with embodiments of the present disclosure.

Preferred embodiments and their advantages are best understood by reference to FIGS. 1 and 2, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems, buses, memories, I/O devices and/or interfaces, storage resources, network interfaces, motherboards, and/or any other components and/or elements of an information handling system.

FIG. 1 illustrates a block diagram of an example information handling system 102 in accordance with certain embodiments of the present disclosure. In certain embodiments, information handling system 102 may comprise a computer chassis or enclosure (e.g., a server chassis holding one or more server blades). In other embodiments, information handling system 102 may be a personal computer (e.g., a desktop computer or a portable computer). As depicted in FIG. 1, information handling system 102 may include a processor 103, a memory system 104 communicatively coupled to processor 103, a basic input/output system (BIOS) 105 communicatively coupled to processor 103, a storage medium 106 communicatively coupled to processor 103, a management controller 107 communicatively coupled to processor 103, and a cooling system 122 communicatively coupled to processor 103.

Processor 103 may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored and/or communicated by one or more of memory system 104, storage medium 106, and/or another component of information handling system 102.

Memory system 104 may be communicatively coupled to processor 103 and may comprise any system, device, or apparatus operable to retain program instructions or data for a period of time (e.g., computer-readable media). Memory system 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off. In particular embodiments, memory system 104 may comprise dynamic random access memory (DRAM).

As shown in FIG. 1, memory system 104 may include memory controller 108, one or more memory modules 116a-116n communicatively coupled to memory controller 108, and a temperature sensor 124. Memory controller 108 may be any system, device, or apparatus configured to manage and/or control memory system 104. For example, memory controller 108 may be configured to read data from and/or write data to memory modules 116 comprising memory system 104. Additionally or alternatively, memory controller 108 may be configured to refresh memory modules 116 and/or memory chips 110 thereof in embodiments in which memory system 104 comprises DRAM. Although memory controller 108 is shown in FIG. 1 as an integral component of memory system 104, memory controller 108 may be separate from memory system 104 and/or may be an integral portion of another component of information handling system 102 (e.g., memory controller 108 may be integrated into processor 103).

Each memory module 116 may include any system, device or apparatus configured to retain program instructions and/or data for a period of time (e.g., computer-readable media). A memory module 116 may comprise a dual in-line package (DIP) memory, a dual-inline memory module (DIMM), a Single In-line Pin Package (SIPP) memory, a Single Inline Memory Module (SIMM), a Ball Grid Array (BGA), or any other suitable memory module.

As depicted in FIG. 1, each memory module 116 may include one or more ranks 118a-118m. Each memory rank 118 within a memory module 116 may be a block or area of data created using some or all of the memory capacity of the memory module 116. In some embodiments, each rank 118 may be a rank as such term is defined by the JEDEC Standard for memory devices.

As shown in FIG. 1, each rank 118 may include a plurality of memory chips 110. Each memory chip 110 may include a packaged integrated circuit configured to comprise a plurality of memory cells for storing data. In some embodiments, a memory chip 110 may include dynamic random access memory (DRAM).

As shown in FIG. 1, a memory module 116 may include a temperature sensor 126. Temperature sensor 126 may comprise any system, device, or apparatus (e.g., a thermometer, thermistor, etc.) configured to communicate a signal to memory controller 108 and/or control logic internal to the memory module 116 indicative of a temperature within memory module 116. Temperature sensors 126 may provide thermal feedback to memory controller 108 or cooling system 122 to allow for closed-loop thermal management of memory module 116 and/or enable other thermal or power management features of a memory module 116.

Temperature sensor 124 may comprise any system, device, or apparatus (e.g., a thermometer, thermistor, etc.) configured to communicate a signal to memory controller 108 indicative of a temperature within memory system 104. In some embodiments, a temperature sensor 124 may detect a temperature associated with memory system 104 at large. In these and other embodiments, memory system 104 may comprise a plurality of temperature sensors 124, wherein each temperature sensor 124 may detect a temperature near a particular component and/or location within memory system 104. For example, where memory system 104 comprises memory modules 116 comprise DIMMs, one or more DIMMs may be monitored by a respective temperature sensor 124. Temperature sensor 124 may provide thermal feedback to memory controller 108 or cooling system 122 to allow for closed-loop thermal management of memory system 104 and/or enable other thermal or power management features of memory system 104.

A BIOS 105 may include any system, device, or apparatus configured to identify, test, and/or initialize information handling resources of information handling system 102, and/or initialize interoperation of information handling system 102 with other information handling systems. "BIOS" may broadly refer to any system, device, or apparatus configured to perform such functionality, including without limitation, a Unified Extensible Firmware Interface (UEFI). In some embodiments, BIOS 105 may be implemented as a program of instructions that may be read by and executed on processor 103 to carry out the functionality of BIOS 105. In these and other embodiments, BIOS 105 may comprise boot firmware configured to be the first code executed by processor 103 when information handling system 102 is booted and/or powered on. As part of its initialization functionality, code for BIOS 105 may be configured to set components of information handling system 102 into a known state, so that one or more applications (e.g., an operating system or other application programs) stored on compatible media (e.g., disk drives) may be executed by processor 103 and given control of information handling system 102.

Storage medium 106 may be communicatively coupled to processor 104. Storage medium 106 may include any system, device, or apparatus operable to store information processed by processor 103. Storage medium 106 may include, for example, network attached storage, one or more direct access storage devices (e.g., hard disk drives), and/or one or more sequential access storage devices (e.g., tape drives). As shown in FIG. 1, storage medium 106 may have stored thereon an operating system (OS) 114. OS 114 may be any program of executable instructions, or aggregation of programs of executable instructions, configured to manage and/or control the allocation and usage of hardware resources such as memory, CPU time, disk space, and input and output devices, and provide an interface between such hardware resources and application programs hosted by OS 114. Active portions of OS 114 may be transferred to memory 104 for execution by processor 103.

As shown in FIG. 1, OS 114 may include a memory capacity control agent 120. Memory capacity control agent 120 may be any program of executable instructions, or aggregation of programs of executable instructions, configured to manage and/or control a capacity of memory of memory system 104 enabled for use based on a thermal configuration of information handling system 102, as described in greater detail below. Active portions of memory capacity control agent 120 may be transferred to memory 104 for execution by processor 103.

Although memory capacity control agent 120 is shown in FIG. 1 as being embodied in OS 114, in other embodiments, memory capacity control agent 120 may be implemented in BIOS 105 or management controller 107, as indicated in FIG. 1 by the rectangles having dashed borders.

Management controller 107 may be configured to provide management facilities for management of information handling system 102. Such management may be "out-of-band" management made by management controller 107 even if information handling system 102 is powered off or powered to a standby state. In certain embodiments, management controller 112 may include or may be an integral part of a baseboard management controller (BMC), a remote access controller (e.g., a Dell Remote Access Controller or Integrated Dell Remote Access Controller), or a chassis management controller (CMC).

Cooling system 122 may include any mechanical or electro-mechanical system, apparatus, or device operable to move coolant (e.g., air, other gases, liquids) throughout a chassis or enclosure of information handling system 102. In some embodiments, cooling system 122 may comprise a fan (e.g., a rotating arrangement of vanes or blades which act on a gaseous coolant such as air). In other embodiments, cooling system 122 may comprise a blower (e.g., a centrifugal fan that employs rotating impellers to accelerate gaseous cooling received at its intake and change the direction of the airflow). In operation, in the case of a cooling system 122 including an air mover (e.g., fan or blower), the air mover may cool information handling resources of information handling system 102 by drawing cool air into an enclosure housing the information handling resources from the outside of the housing, expelling warm air from inside the enclosure to the outside of such enclosure, and/or moving air across one or more heatsinks (not explicitly shown) internal to the enclosure to cool one or more information handling resources. Although not explicitly depicted in FIG. 1, cooling system 122 may also include one or more heating elements in air flow paths which may be enabled to pre-heat air before it is delivered to an information handling resource (e.g., memory system 104 or a portion thereof) in order to provide heat to such information handling resource. In these and other embodiments, cooling system 122 may include one or more air deflection structures, such as, for example, static or dynamically adjustable air ducts and/or plenums, to steer air flow towards or away from particular information handling resources as desired. Parameters for controlling air flow (e.g., air mover speed, positions of air deflection structures, etc.) and/or heat of air (e.g., heating elements within the air flow) may be managed and controlled by a thermal management system of cooling system 122.

In other embodiments, cooling system 122 may comprise mechanisms other than a blower for moving coolant, including liquid pumps, jets, and/or free convection enclosures. In these and other embodiments, rotating and other components for moving coolant by cooling system 122 may be driven by a motor or other mechanical device.

In these and other embodiments, some components of cooling system 122, in particular logical control components of cooling system 122, may be implemented within management controller 107.

In addition to processor 103, memory 104, BIOS 105, storage medium 106, management controller 107, and cooling system 122, information handling system 102 may include one or more other information handling resources.

In operation, memory capacity control agent 120 may, at boot, powering on, or another initialization of information handling system 102, determine cooling system 122's capability for cooling memory devices of memory system 104. Such cooling capability may be based on factors such as a system inlet temperature to information handling system 102, a hardware configuration of information handling system 102, and/or other system attributes (e.g., characterized during system development of information handling system 102). Memory capacity control agent 120 may also be configured to manipulate the usable capacity of memory devices installed with memory system 104 in order to maintain a power consumption of memory system 104 to a level which falls within the determined cooling capability. Memory capacity control agent 120 may manipulate the usable capacity of memory devices installed with memory system 104 by causing memory controller 108 to: (i) appropriately enable or disable individual memory modules 116, (ii) appropriately enable or disable individual memory chips 110, and (iii) appropriately report an available memory capacity to the operating system such that only the reported memory is available for use by the operating system, in order to establish the memory capacity which supports adequate cooling.

In embodiments in which memory capacity control agent 120 is embodied within operating system 114 (or by an application executing on operating system 114), memory capacity control agent 120 may manage memory capacity in real time to ensure proper cooling is maintained during system runtime to account for changes in ambient temperature, hardware configuration (e.g., hot swapping of information handing resources), and/or other system events. The correlation of memory capacity versus power may be characterized during system development of information handling system 102 and may be optimized to ensure the maximum amount of memory capacity of memory system 104 is available to a user.

One example practical usage model for the methods and systems described herein is when a user is operating information handling system 102 at an elevated ambient temperature, in which memory capacity control agent 120 may disable a suitable amount of memory capacity to reduce power consumption of memory system 104 to prevent overheating. Another example practical usage model may occur when an air mover for cooling components of information handling system 102 fails, responsive to which memory capacity control agent 120 may disable a suitable amount of memory capacity to reduce power consumption of memory system 104 to prevent overheating. A further example practical usage model may occur when a hardware configuration (e.g., storage device count) of information handling system 102 changes after an initial configuration of information handling system 102 resulting in a reduced system thermal margin, responsive to which memory capacity control agent 120 may disable a suitable amount of memory capacity to reduce power consumption of memory system 104 to prevent overheating. Additionally, the methods and systems described herein may ensure future compatibility, allowing for memory system 104 to be upgraded to newer, higher capacity and/or higher power memory devices.

FIG. 2 illustrates a flow chart of an example method 200 for power and thermal throttling of memory devices via capacity reduction, in accordance with embodiments of the present disclosure. According to some embodiments, method 200 may begin at step 202. As noted above, teachings of the present disclosure may be implemented in a variety of configurations of information handling system 102. As such, the preferred initialization point for method 200 and the order of the steps comprising method 200 may depend on the implementation chosen.

At step 202, in response to boot, powering on, or another initialization of information handling system 102, memory capacity control agent 120 may determine cooling system 122's capability for cooling memory devices of memory system 104. Such cooling capability may be based on factors such as a system inlet temperature to information handling system 102, a hardware configuration of information handling system 102, and/or other system attributes (e.g., characterized during system development of information handling system 102).

At step 204, in response to the determined capacity for cooling memory devices, memory capacity control agent 120 may configure the usable capacity of memory devices installed with memory system 104 in order to maintain a power consumption of memory system 104 to a level which falls within the determined cooling capability. Memory capacity control agent 120 may manipulate the usable capacity of memory devices installed with memory system 104 by causing memory controller 108 to appropriately enable or disable individual memory modules 116 and/or appropriately enable or disable individual memory chips 110 in order to establish the memory capacity which supports adequate cooling.

In embodiments in which memory capacity control agent 120 is embodied in BIOS 105, method 200 may end after execution of step 204 (as indicated by dashed lines). However, in embodiments in which memory capacity control agent 120 is embodied in operating system 114 or management controller 107, method 200 may return to step 202, thus enabling runtime manipulation of memory capacity in order to maintain adequate cooling in response to runtime changes in configuration (e.g., changes in ambient temperature, hardware configuration, and/or other system events).

Although FIG. 2 discloses a particular number of steps to be taken with respect to method 200, method 200 may be executed with greater or fewer steps than those depicted in FIG. 2. In addition, although FIG. 2 discloses a certain order of steps to be taken with respect to method 200, the steps comprising method 200 may be completed in any suitable order.

Method 200 may be implemented using processor 103, operating system 114, BIOS 105, management controller 107, and/or any other system operable to implement method 200. In certain embodiments, method 200 may be implemented partially or fully in software and/or firmware embodied in computer-readable media.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. An information handling system comprising:
   a processor;
   a memory system communicatively coupled to the processor;
   a cooling system configured to provide thermal control for information handling resources of the information handling system; and
   a memory capacity control agent embodied as a program of instructions configured to, when executed:
      determine a capability of the cooling system for cooling memory devices of the memory system based on a hardware configuration of the information handling system; and
      in response to a determination that the capability of the cooling system is insufficient to cool the memory system when a memory capacity of the memory system is operating at a full capacity, manipulate the memory capacity of the memory system to operate at a reduced capacity, such that the cooling system is sufficient to cool the memory system when the memory capacity is operating at the reduced capacity.

2. The information handling system of claim 1, wherein the capability of the cooling system is further based on an ambient temperature associated with the information handling system.

3. The information handling system of claim 1, wherein the hardware configuration comprises system attributes of the information handling system determined during system characterization of the information handling system.

4. The information handling system of claim 1, wherein manipulating the memory capacity of the memory system based on the capability comprises at least one of:
   enabling and disabling individual memory modules of the memory system;
   enabling and disabling individual memory chips of the individual memory modules; and
   reporting an available memory capacity to an operating system such that only the reported memory is available for use by the operating system.

5. The information handling system of claim 1, wherein the memory capacity control agent is embodied in an operating system executing on the processor.

6. The information handling system of claim 5, wherein the memory capacity control agent is configured to, periodically during runtime of the information handling system:
   determine a modified capability of the cooling system for cooling memory devices of the memory system; and
   manipulate the memory capacity of the memory system based on the modified capability.

7. The information handling system of claim 1, wherein the memory capacity control agent is embodied in a management controller communicatively coupled to the processor and configured to provide out-of-band control of the information handling system, wherein the out-of-band control of the information handling system includes controlling the information handling system while the information handling system is powered off or powered to a standby state.

8. The information handling system of claim 1, wherein the memory capacity control agent is embodied in a basic input/output system of the information handling system.

9. A method comprising:
   determining a capability of a cooling system of an information handling system for cooling memory devices of a memory system of the information handling system based on a hardware configuration of the information handling system; and
   in response to a determination that the capability of the cooling system is insufficient to cool the memory system when a memory capacity of the memory system is operating at a full capacity, manipulating the memory capacity of the memory system to operate at a reduced capacity, such that the cooling system is sufficient to cool the memory system when the memory capacity is operating at the reduced capacity.

10. The method of claim 9, wherein the capability of the cooling system is further based on an ambient temperature associated with the information handling system.

11. The method of claim 9, wherein the hardware configuration comprises system attributes of the information handling system determined during system characterization of the information handling system.

12. The method of claim 9, wherein manipulating the memory capacity of the memory system based on the capability comprises at least one of:
   enabling and disabling individual memory modules of the memory system;
   enabling and disabling individual memory chips of the individual memory modules; and
   reporting an available memory capacity to an operating system such that only the reported memory is available for use by the operating system.

13. The method of claim 9, further comprising:
   determining a modified capability of the cooling system for cooling memory devices of the memory system; and
   manipulating the memory capacity of the memory system based on the modified capability.

14. An article of manufacture comprising:
   a non-transitory computer-readable medium; and
   computer-executable instructions carried on the computer-readable medium, the instructions readable by a processor, the instructions, when read and executed, for causing the processor to:
      determine a capability of a cooling system of an information handling system for cooling memory devices of a memory system of the information handling system based on a hardware configuration of the information handling system; and
      in response to a determination that the capability of the cooling system is insufficient to cool the memory system when a memory capacity of the memory system is operating at a full capacity, manipulate the memory capacity of the memory system to operate at a reduced capacity, such that the cooling system is sufficient to cool the memory system when the memory capacity is operating at the reduced capacity.

15. The article of claim 14, wherein the capability of the cooling system is further based on an ambient temperature associated with the information handling system.

16. The article of claim 14, wherein the hardware configuration comprises system attributes of the information handling system determined during system characterization of the information handling system.

17. The article of claim 14, wherein manipulating the memory capacity of the memory system based on the capability comprises at least one of:
   enabling and disabling individual memory modules of the memory system;
   enabling and disabling individual memory chips of the individual memory modules; and
   reporting an available memory capacity to an operating system such that only the reported memory is available for use by the operating system.

18. The article of claim 14, the instructions for further causing the processor to:
   determine a modified capability of the cooling system for cooling memory devices of the memory system; and
   manipulate the memory capacity of the memory system based on the modified capability.

* * * * *